(12) United States Patent
Bazlen

(10) Patent No.: US 9,222,173 B2
(45) Date of Patent: Dec. 29, 2015

(54) VACUUM PROCESSING DEVICE

(75) Inventor: Rolf Bazlen, Rorschach (CH)

(73) Assignee: EVATEC ADVANCED TECHNOLOGIES AG, Balzers (LI)

( * ) Notice: Subject to any disclaimer, the term of this patent is extended or adjusted under 35 U.S.C. 154(b) by 635 days.

(21) Appl. No.: 13/701,591

(22) PCT Filed: May 28, 2011

(86) PCT No.: PCT/EP2011/002650
§ 371 (c)(1),
(2), (4) Date: Feb. 5, 2013

(87) PCT Pub. No.: WO2011/151041
PCT Pub. Date: Dec. 8, 2011

(65) Prior Publication Data
US 2013/0133576 A1    May 30, 2013

Related U.S. Application Data

(60) Provisional application No. 61/351,349, filed on Jun. 4, 2010.

(51) Int. Cl.
*C23C 16/52* (2006.01)
*C23C 16/44* (2006.01)

(52) U.S. Cl.
CPC ............. *C23C 16/52* (2013.01); *C23C 16/4409* (2013.01); *C23C 16/4412* (2013.01)

(58) Field of Classification Search
CPC .................................................. C23C 16/4412
USPC ...................... 118/715; 156/345.29
See application file for complete search history.

(56) References Cited

U.S. PATENT DOCUMENTS

| | | | | |
|---|---|---|---|---|
| 2,683,614 A | * | 7/1954 | Warren | 277/628 |
| 5,484,484 A | * | 1/1996 | Yamaga et al. | 118/719 |
| 5,536,324 A | * | 7/1996 | Fuchita | 118/726 |

(Continued)

OTHER PUBLICATIONS

International Search Report for PCT/EP2011/002650 dated Oct. 12, 2011.

(Continued)

*Primary Examiner* — Rudy Zervigon
(74) *Attorney, Agent, or Firm* — Pearne & Gordon LLP

(57) ABSTRACT

An exhaust opening of a process chamber (12) contained in a vacuum chamber (11) is connected to an exhaust line (13) by a connector comprising a bellows (03) with one end which is connected to the exhaust line (13) fixed to a housing and its opposite end carrying a coupling tube (02) for connecting to a coupling ring (01) which surrounds the exhaust opening, the coupling tube (02) being elastically biased towards the same. The coupling tube (02) can be moved between a connected state where it is in contact with the coupling ring (01) and a disconnected state by an actuator reciprocatable in an axial direction perpendicular to the exhaust opening. To enable a gas-tight connection with the process chamber (12) the coupling tube (02) has lateral play such that it can align with the coupling ring (01) when a conical surface of the coupling tube (02) contacts a complementary conical surface on the coupling ring (01) in the connected state. The actuator comprises two rods (04) which extend through drill holes of an outward extending holding ring (05) of the coupling tube (02) and interact with the same in such a way that the lateral position of the coupling tube (02) is fixed in the disconnected state.

12 Claims, 6 Drawing Sheets

(56) References Cited

U.S. PATENT DOCUMENTS

| | | | |
|---|---|---|---|
| 5,588,999 A * | 12/1996 | Takahashi | 118/715 |
| 5,853,607 A | 12/1998 | Zhao et al. | |
| 6,063,201 A * | 5/2000 | Lee et al. | 118/719 |
| 6,251,189 B1 * | 6/2001 | Odake et al. | 118/715 |
| 6,261,408 B1 | 7/2001 | Schneider et al. | |
| 6,273,664 B1 * | 8/2001 | Doche | 414/217 |
| 6,702,901 B2 | 3/2004 | Buschbeck et al. | |
| 6,932,885 B1 * | 8/2005 | Oka | 156/345.55 |
| 8,741,062 B2 * | 6/2014 | Lindfors et al. | 118/715 |
| 9,068,261 B2 * | 6/2015 | Murata et al. | |
| 2002/0108573 A1 * | 8/2002 | Buschbeck et al. | 118/722 |
| 2004/0177810 A1 * | 9/2004 | Ohta | 118/718 |
| 2004/0182423 A1 * | 9/2004 | Nakao | 134/22.1 |
| 2007/0032047 A1 | 2/2007 | Hasebe et al. | |
| 2007/0089835 A1 * | 4/2007 | Koshimizu et al. | 156/345.29 |
| 2011/0303147 A1 * | 12/2011 | Tachibana et al. | 118/715 |
| 2011/0305836 A1 * | 12/2011 | Murata et al. | 427/255.28 |
| 2013/0133576 A1 * | 5/2013 | Bazlen | 118/712 |

OTHER PUBLICATIONS

Written Opinion for PCT/EP2011/002650 dated Oct. 12, 2011.

* cited by examiner

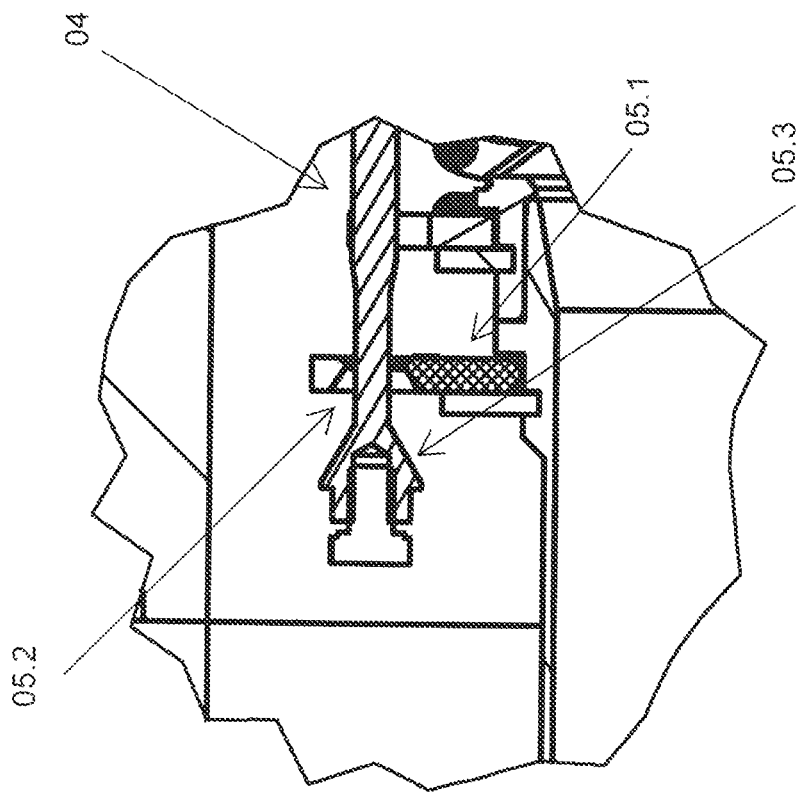

VACUUM PROCESSING DEVICE

FIELD OF THE INVENTION

The invention relates to a vacuum processing device, in particular to a device as used in chemical vapour deposition (CVD) and plasma enhanced chemical vapour deposition (PECVD).

PRIOR ART

From U.S. Pat. No. 6,702,901 B2 a vacuum processing device is known where a process chamber in the shape of a quartz tube is arranged inside a similar vacuum chamber and connected to an exhaust line via a duct consisting of a bellows with a distal end fixedly connected to an exhaust opening of a flange of the process chamber and an opposite proximal end fixedly connected to the exhaust line.

With this arrangement an easy exchange of the process chamber is usually not possible which renders use of the device for different purposes difficult. In any case, the requirement would entail severe constraints on design options.

More versatile connections are possible using O-rings but these solutions have other disadvantages, in particular wear of the O-rings under gliding relative motions of the parts which requires frequent exchange of the rings and causes contamination of the vacuum by particles.

SUMMARY OF THE INVENTION

It is the primary object of the invention to provide a vacuum processing device with a similar 'box-in-box' structure, i.e., with the process chamber being arranged inside a vacuum chamber where the pressure can be kept at a lower level such that gas leaking from the process chamber is reliably retained inside the vacuum chamber and where nevertheless the process chamber can be easily exchanged.

This object is achieved by the features of claim 1. The claimed vacuum processing device provides a connector which releasably connects the process chamber to the exhaust. At the same time, the connection is reliable even under mechanical strains such as are caused, e.g., by different thermal expansions of the various parts of the device.

Another object of the invention is to provide a supply line for the process chamber which is automatically blocked if the pressure in the chamber is above a certain threshold. Otherwise a process gas for a processing step may be supplied before gas from a previous processing step is completely removed. This may have negative consequences for the quality of the processing and may in some cases also be dangerous, leading to unintended chemical reactions with detrimental consequences.

This object is achieved by the features of claim 9 which are, in principle, independent of the features of claim 1 where they relate to the connector and may be made use of with a conventional connection between the process chamber and the exhaust line as well.

BRIEF DESCRIPTION OF THE DRAWINGS

FIG. 3A shows, at a larger scale, a detail from FIG. 1.

DESCRIPTION OF THE PREFERRED EMBODIMENTS

Figure 1:
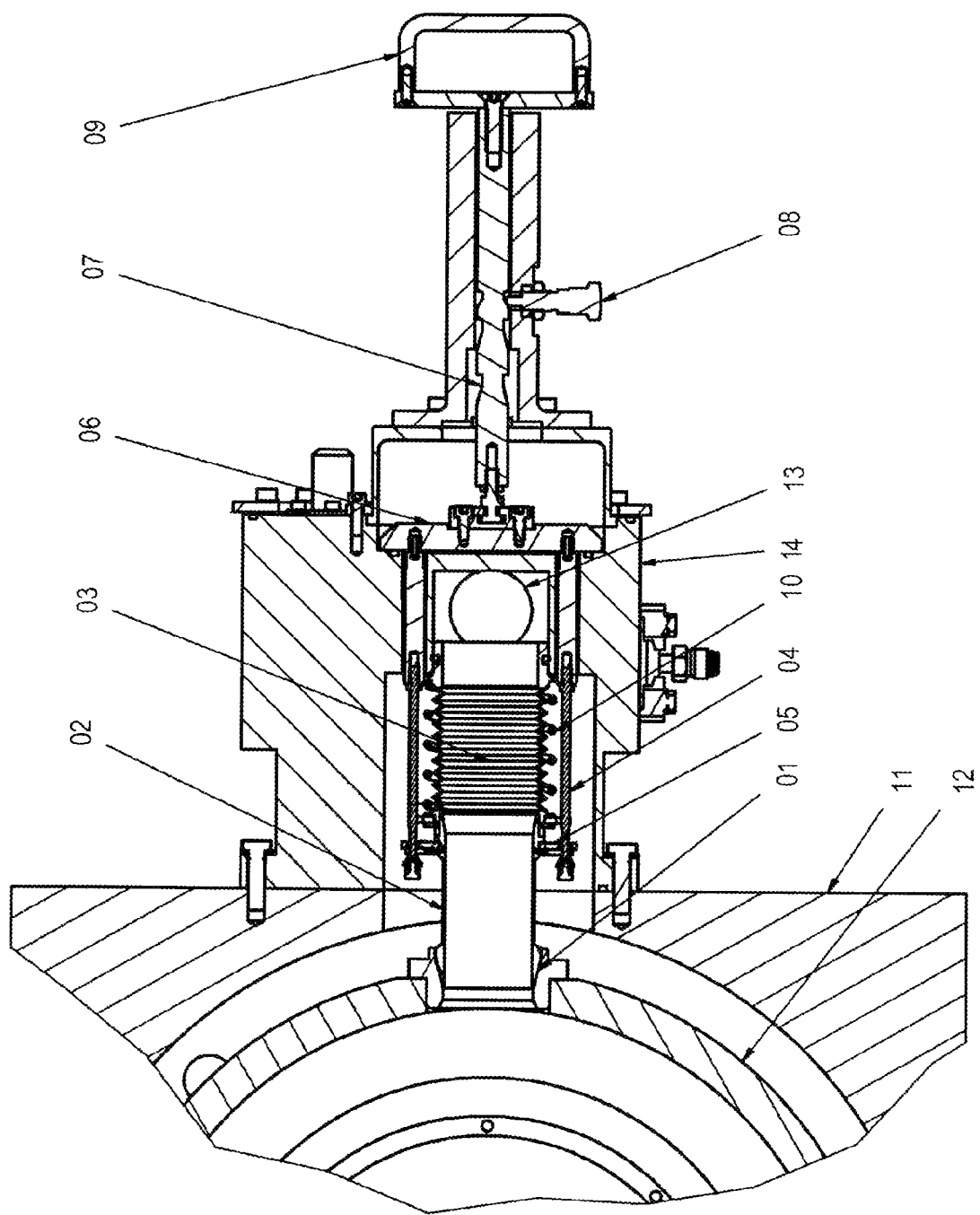
FIG. 1 shows a longitudinal section through part of a vacuum processing device according to the invention with a connector in a connected state.

The solution according the invention describes a connection between a process chamber inside a vacuum chamber with an exhaust pipe which will usually lead to a vacuum pumping station. The connector used can change between a connected state and a disconnected state. It compensates relative motions between components as caused by different thermal expansions and prevents leakage of process gas to the atmosphere. The connector has a duct comprising a coupling tube 02, which is a) reciprocatable back and forth relative to a contact ring 01 and provides at the same time b) a lateral degree of freedom by means of a flexible bellows 03 extending in an axial direction and surrounded by a spring 10, both of which are guided by rods 04. A drawbar 07 is mechanically joined to said rods 04 via a sealing plate 06 which form an actuator allowing switching the connector from outside the vacuum/process chamber between the connected and the disconnected state.

The vacuum processing device is described in more detail in the following:

With reference to FIG. 1, a process chamber 12 (interior chamber) is enclosed in a vacuum chamber 11 (exterior housing). The inner process chamber 12 has an opening with a contact ring 01 surrounding an exhaust opening of the process chamber 12 which can be operatively connected with coupling tube 02 of a connector. The coupling tube 02 exhibits on a distal end a convex conical coupling face adopted to sealingly match a complementary concave conical contact face of the contact ring 01. Another part of the duct is formed by a flexible bellows 03. Said bellow 03 is used for the compensation of tolerances and relative movements of the two chambers 11, 12. At a proximal end of the duct the bellows 03 is attached to a wall of the vacuum chamber 11 or a pump connector 14 which forms a housing for the connector as shown in FIG. 1, where an exhaust line 13 is attached which conducts gases to a pump station (not shown). Furthermore, the bellows 03 is surrounded by a spring 10 and accompanied by at least two rods 04 of an actuator, the rods 04 stabilizing spring 10 and bellows 03. The rods 04 engage with the coupling tube 02 and are fixed to a sealing plate 06. The sealing plate 06 seals the vacuum chamber 12 against atmosphere and is connected to a drawbar 07 such that it can be moved in an axial direction, the drawbar 07 carrying a handle 09 arranged outside the housing. The drawbar 07 can be fixed or locked, e.g., by means of a bolt 08 engaging with notches of the drawbar 07.

Each of the rods 04 extends through an opening, a drill hole 05.2, through an annular holding ring 05.1 of the coupling tube 02 which serves as a holding and guiding device 05 with lateral clearance. The guiding device 05 is shown in FIG. 3A with the connector in the connected state of FIG. 1 and in FIG. 3B with the connector in the disconnected state shown in FIG. 2. An end piece 05.3 of the rod 04 has a convex conical stop surface which, in the disconnected state (FIG. 3B), is in contact with a concave conical counter surface surrounding the drill hole 05.2 at its distal side, keeping the coupling tube in a center position, locked against lateral movement. When the connector approaches the connected position, the stop surfaces disengage from the counter surfaces whereby the coupling tube is given some freedom of lateral movement such that the coupling tube 02 can adapt to the exact position of the contact ring, its coupling surface being guided by the contact surface of the contact ring 01.

In the connected state of the connector as shown in FIG. 1 the coupling surface of coupling tube 02 is pressed against the contact ring 01 surrounding the exhaust opening of process chamber 12 by spring 10 elastically biasing the coupling tube 02 towards the exhaust opening. The alignment caused by the abutment between the contact surface and the complementary coupling surface which is forced against it by the spring 10 serve to position the coupling tube 02 so as to keep it in a stable sealing position. Even if process chamber 12 is moving relatively to vacuum chamber 11 in all dimensions due to thermal stress, the sealing function holds. Bellows 03 is able to compensate said multi-directional movements, while its flanges are fixedly connected with both the coupling tube 02 and the housing of the connector which is fixed to vacuum chamber 11. The two rods 04 have in this position sufficient clearance to allow movements in all necessary directions (FIG. 3A).

Figure 2:
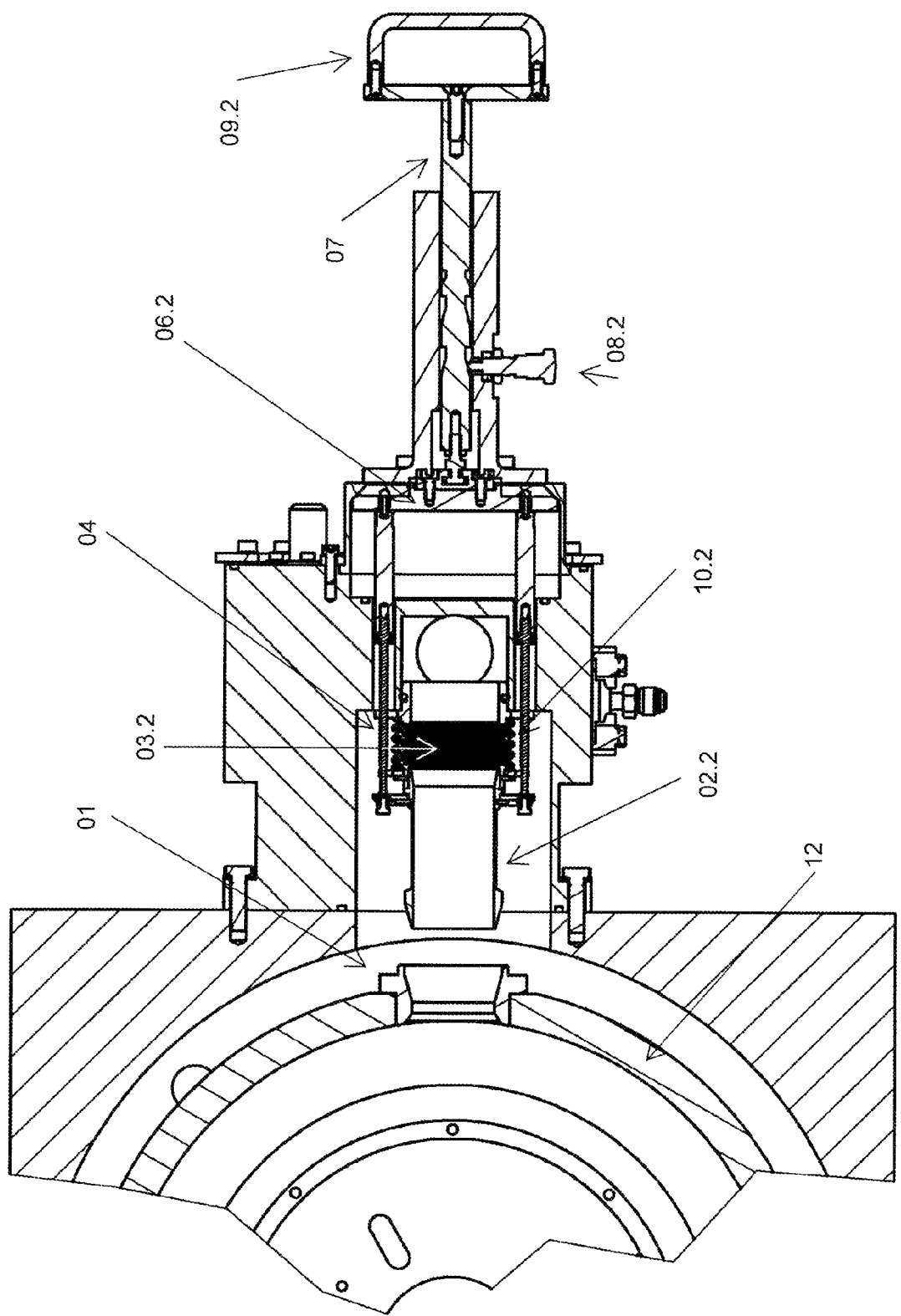
FIG. 2 shows a longitudinal section corresponding to FIG. 1, with the connector in a disconnected state.
Figure 3B:
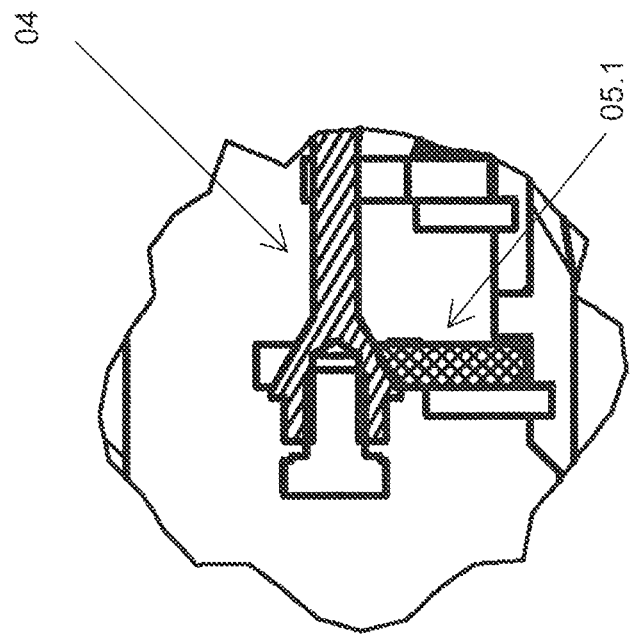
FIG. 3B shows, at a larger scale, a detail from FIG. 2.

For releasing the vacuum-pump-connection by switching the connector into the disconnected state the handle 09 is pulled outward (shown as 09.2 in FIG. 2). The stop surfaces on the end pieces 05.3 of rods 04 abut the counter surfaces on the holding ring 05.1 (FIG. 3B). Because of the centering effect of the contact between the rods and the holding ring 05.1 the coupling tube 02 is forced into a center position before it is further retracted by the rods 04 against the force of the spring 10; with the connector in the disconnected state (FIG. 2) spring 10.2 and bellows 03.2 are compressed. At the same time the distal end of contact tube 02.2 is now completely disconnected and at a distance from the contact ring 01 of the process chamber 12. Bolt 08.2 has snapped into a lateral notch of the drawbar 07 and locked it at its extended position. Due to their being fixed in the center position there is no risk of the coupling tube 02 and the bellows 03 colliding with any part of the housing and their axial movement being obstructed.

To connect process chamber 12 again with the coupling tube 02, the bolt 08.2 is withdrawn and the drawbar 07 released. The force of spring 10.2 pushes coupling tube 02 (02.2) into the contact ring 01 until a sealing position is reached and the connector has resumed its connected state. Centering or alignment of coupling tube 02 (02.2) with the contact ring 01 of the process chamber 12 is not necessary as it is taken care of by the abutment of the coupling surface of the coupling tube 02 against the complementary contact surface of contact ring 01, the rods 04 allowing the coupling tube 02 sufficient lateral play when it approaches the contact ring 01.

The connector according to the present invention may further incorporate a gas supply line and a supply valve controlling the same, in other words feed of gas can be connected/disconnected simultaneously with the pump line.

Figure 4A:
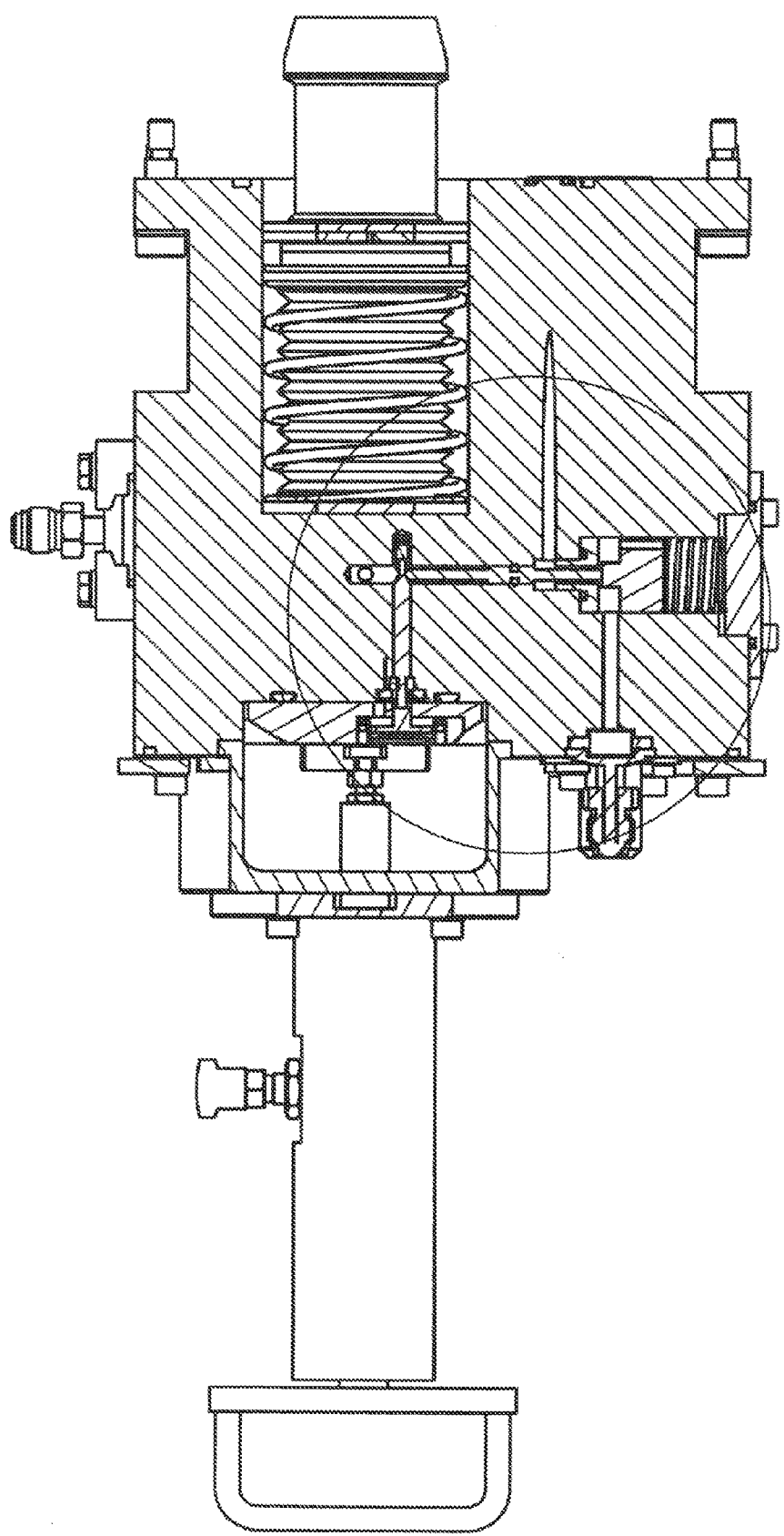
FIG. 4A shows another longitudinal section through part of a vacuum processing device with a supply line.
Figure 4B:
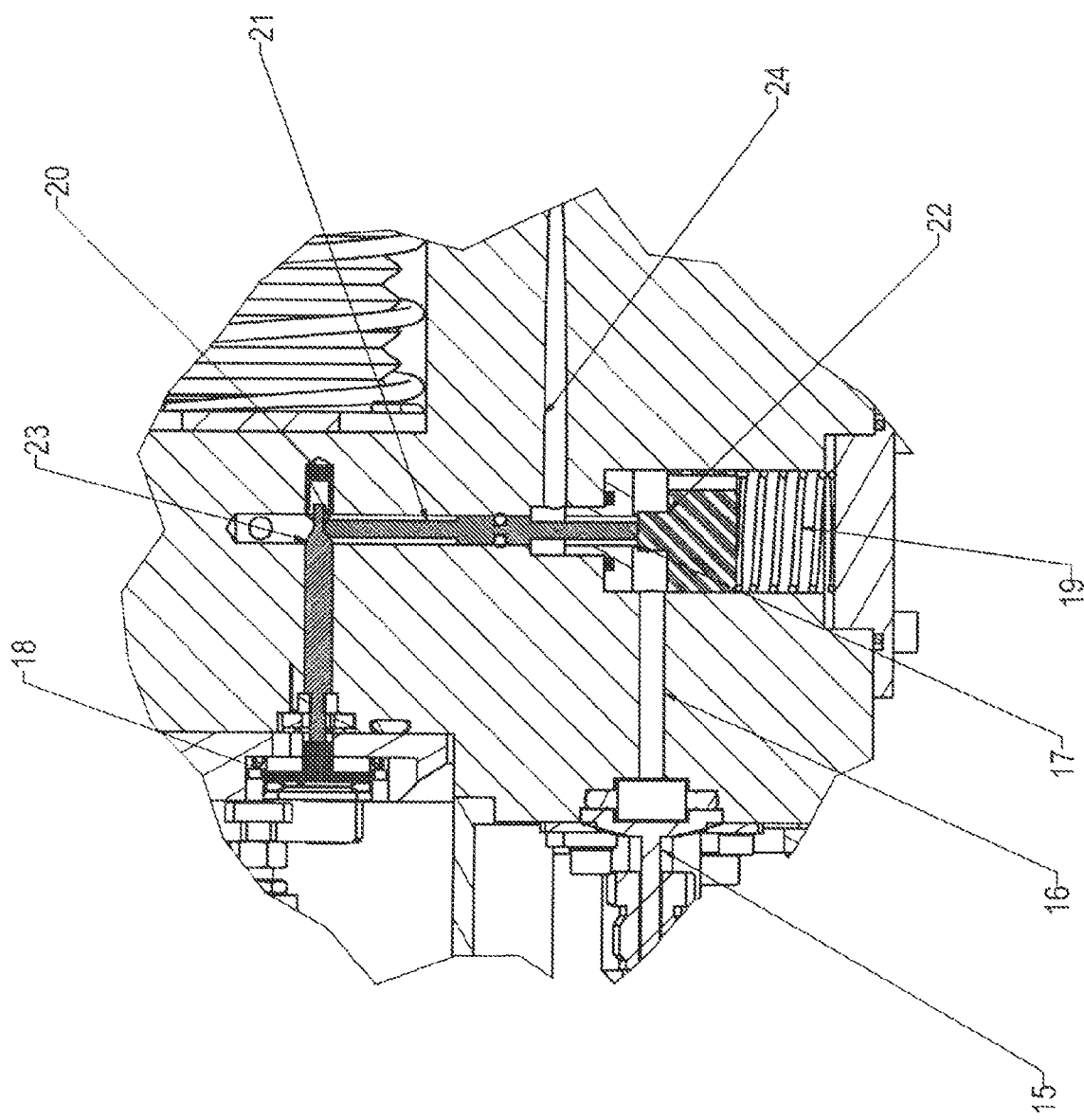
FIG. 4B shows, at a larger scale, the encircled portion of FIG. 4A.

FIG. 4A shows the arrangement of the additional gas supply shutoff device in the connector actuating device. FIG. 4B shows the details of said mechanism and is referred to in the following. FIG. 4B shows the gas supply shutoff device in the closed position. From a supply port 15 a process can be supplied to the process chamber 12. It enters a first part of a supply line, an outer gas duct 16. The gas is blocked from flowing further into an inner gas duct 24 by a supply valve which is shown in a closed state where a valve piston 22 which is reciprocatable in a first direction is held in a blocking position where it seals a connecting opening leading to the inner gas duct 24 which in turn forms part of a connection with the process chamber 12, being is pressed against a seal seat 17 surrounding the connecting opening by a spring 19.

When the connector is in the connected state shown in FIG. 1 the process chamber 12 can be evacuated via the coupling tube 02, the bellows 03 and the exhaust line 13. A sensor piston 18 which is reciprocatable in a second direction essentially perpendicular to the first direction carries a sensor surface which is in fluid-conducting connection with the process chamber 12 and therefore exposed to the pressure prevailing in the same. If the said pressure is sufficiently low for a spring 20 to force a rod 23 of the sensor piston 18 to the left in FIG. 4B a first surface at the end of a rod 21 of the valve piston 18 which is in contact with a parallel second surface formed on a tapered tip of the rod 23 and slidable along the said first surface acts against the same, pushing the valve piston 22 downward against the force of spring 19. Thereby piston 22 is moved away from the blocking position where it rests against the seal seat 17 into a passing position where it is a distance away from the said seal seat 17, i.e., the supply valve is switched from a closed to an open state. Gas can now pass from the outer gas duct 16 via the connecting opening into the inner gas duct 24.

FIG. 4B shows an arrangement where two rods are acting on each other. It is clear, however, that without deviating from the inventive idea a single rod can act on the valve piston analogously. It is important that the supply valve for allowing the inflow of gas is not controlled from the outside, but the valve only opens if a sufficiently high vacuum has been established inside the process chamber. Even if a leak at another part of the system (not the valve arrangement) exists, the inflow of hazardous gases will not be possible. Technically this can be achieved by an actuating means which is activated by the vacuum to be generated and a counterforce like a spring or ambient atmospheric pressure.

For safety reasons it is important to check the working position of the valve arrangement with the help of the draw bar 07 or grip 09 respectively. With the draw bar in its "out" position all gas supply systems must be closed. On the other side when the draw bar 07 is at "in" position all gas supply systems have to be in run modus.

The very compact arrangement of gas supply, exhaust connection and actuators allows this vacuum-pipe-connection to the process chamber to be very easy to handle, repeatable, safe and to be activated without additional tools. The valve arrangement as shown allows "zero defect operation", since unless the vacuum connector works properly, no gas flow is possible.

Thus, the invention relates to a vacuum processing device comprising a process chamber 12, a vacuum chamber 11 containing the said process chamber, an exhaust line 13 outside the vacuum chamber 11, a connector with a housing, with a duct for connecting an exhaust opening of the process chamber 12 which is surrounded by a contact ring 01 with the exhaust line 13, the duct comprising a bellows 03 extending in an axial direction and carrying a coupling tube 02 for connecting a distal end of the duct facing the exhaust opening to the contact ring 01 in a gas-tight manner, and the bellows 03 being, at an opposite proximal end of the duct, fixed to the housing and connected, equally in a gas-tight manner, to the exhaust line 13, and with an actuator for switching the duct between a connected state where the coupling tube 02 contacts the contact ring 01 and a disconnected state where, with the bellows 03 contracted, the coupling ring 01 is at an axial distance from the contact ring 01, the actuator being reciprocatable in the axial direction and interacting with the coupling tube 02 so as to allow the same at least limited play in a lateral direction perpendicular to the axial direction in the connected state.

In a preferred implementation of the invention the coupling tube 02 is elastically biased towards the exhaust opening.

In a further preferred implementation of the invention the contact ring 01 has a concave conical contact face surrounding the exhaust opening and narrowing towards the interior of the process chamber 12 and the coupling tube 02 has, at the distal end, a complementary convex conical coupling face, the contact face and the coupling face being in sealing contact when the connector is in the connected state.

In a further preferred implementation of the invention the actuator interacts with the coupling tube 02 in such a way that the latter is fixed at a center position in the disconnected state.

In a further preferred implementation of the invention the actuator comprises at least one rod 04 extending in the axial direction and exhibiting a stop surface inclined with respect to the axial direction, whereas the coupling tube 02 carries, for each stop surface, a corresponding counter surface parallel to the same such that in the disconnected state each stop surface is in contact with the corresponding counter surface, whereby the lateral position of the coupling tube 02 is fixed at the center position.

In a further preferred implementation of the invention the actuator comprises at least two rods 04 and each counter surface is a conical surface surrounding, at the distal side of the same, a hole through which the respective rod 04 extends, whereas the stop surface is a complementary conical surface.

In a further preferred implementation of the invention the counter surface is in each case concave and widens towards the distal end.

In a further preferred implementation of the invention each hole is a drill hole 05.2 through an outward-extending annular holding ring 05.1 of the coupling tube 02.

In a further preferred implementation of the invention the actuator comprises a handle 09 arranged on the outside of the housing.

According to a second aspect of the invention, the vacuum processing device comprising a process chamber 12, a vacuum chamber 11 containing the said process chamber, an exhaust line 13 outside the vacuum chamber 11, and a connector for connecting the process chamber 12 with the exhaust line 13 further comprises a supply line connecting a supply port 15 with the process chamber 12, a supply valve arranged in the supply line which is switchable between a closed state where it blocks the supply line and an open state where the supply line is open such that gas may pass through it, a sensor controlling the supply valve, the sensor comprising a sensor surface connected to the process chamber 12 so as to be exposed to the gas pressure in the same and being configured so as to keep the supply valve in its closed state when the said gas pressure acting on the said sensor surface is above a threshold and to keep it in its open state otherwise.

In a preferred implementation of the invention the supply valve comprises a valve piston 22 reciprocatable along a first direction between a blocking position at a connecting opening such that the supply valve is in its closed state, and a passing position away from the connecting opening such that the supply valve is in its open state, the valve piston 22 being elastically biased towards the blocking position, whereas the actuating device comprises a sensor piston 18 reciprocatable in a second direction which is approximately perpendicular to the first direction and a front of which carries the sensor surface, the sensor piston 18 being elastically biased towards the said front in such a way that it is kept in a first position against an elastic force by the pressure acting on the sensor surface if the said pressure is above the threshold whereas it is kept in a second position by the said elastic force if the pressure is below the threshold, the sensor piston 18 acting on the valve piston 22 in such a way that the latter is in the blocking position if the sensor piston 18 is in the first position and in the passing position if the sensor piston 18 is in the second position.

In a further preferred implementation of the invention the sensor piston 18 acts on a first surface of the valve piston 22 which is inclined with respect to the first direction and with respect to the second direction via a second surface of the sensor piston 18 which is slidable along the first surface.

What is claimed is:

1. Vacuum processing device comprising a process chamber, a vacuum chamber containing the said process chamber, an exhaust line outside the vacuum chamber, a connector with a housing, with a duct for connecting an exhaust opening of the process chamber which is surrounded by a contact ring with the exhaust line, where the duct comprises a bellows extending in an axial direction and carrying a coupling tube for connecting a distal end of the duct facing the exhaust opening to the contact ring in a gas-tight manner, and where the bellows is, at an opposite proximal end of the duct, fixed to the housing and connected, equally in a gas-tight manner, to the exhaust line, and with an actuator for switching the duct between a connected state where the coupling tube contacts the contact ring and a disconnected state where, with the bellows contracted, the coupling ring is at an axial distance from the contact ring, where the actuator is reciprocatable in the axial direction and cooperative with the coupling tube so as to allow the same at least limited play in a lateral direction perpendicular to the axial direction in the connected state.

2. Vacuum processing device according to claim 1, where the coupling tube is elastically biased towards the exhaust opening.

3. Vacuum processing device according to claim 1, where the contact ring has a concave conical contact face surrounding the exhaust opening and narrowing towards the interior of the process chamber and the coupling tube has, at a distal end, a complementary convex conical coupling face, the contact face and the coupling face being in sealing contact when the connector is in the connected state.

4. Vacuum processing device according to claim 1, where the actuator interacts with the coupling tube in such a way that the latter is fixed at a center position in the disconnected state.

5. Vacuum processing device according to claim 4, where the actuator comprises at least one rod extending in the axial direction and exhibiting a stop surface inclined with respect to the axial direction, whereas the coupling tube carries, for each stop surface, a corresponding counter surface parallel to the same such that in the disconnected state each stop surface is in contact with the corresponding counter surface, whereby the lateral position of the coupling tube is fixed at the center position.

6. Vacuum processing device according to claim 5, where the actuator comprises at least two rods and each counter surface is a conical surface surrounding, at the distal side of the same, a hole through which the respective rod extends, whereas the stop surface is a complementary conical surface.

7. Vacuum processing device according to claim 6, where the counter surface is in each case concave and widens towards the distal end.

8. Vacuum processing device according to claim 6, where each hole is a drill hole through an outward-extending annular holding ring of the coupling tube.

9. Vacuum processing device according to claim 1, where the actuator comprises a handle arranged on the outside of the housing.

10. Vacuum processing device according to claim 1, further comprising a supply line for connecting a supply port with the process chamber, a supply valve arranged in the supply line which is switchable between a closed state where it blocks the supply line and an open state where the supply line is open such that gas may pass through it, a sensor controlling the supply valve, the sensor comprising a sensor surface connected to the process chamber so as to be exposed to the gas pressure in the same and being configured so as to keep the supply valve in its closed state when the said gas pressure acting on the said sensor surface is above a threshold and to keep it in its open state otherwise.

11. Vacuum processing device according to claim 10, where the supply valve comprises a valve piston reciprocatable along a first direction between a blocking position at a connecting opening such that the supply valve is in its closed state, and a passing position away from the connecting opening such that the supply valve is in its open state, the valve piston being elastically biased towards the blocking position, whereas the actuating device comprises a sensor piston reciprocatable in a second direction which is approximately perpendicular to the first direction and a front of which carries the sensor surface, the sensor piston being elastically biased towards the said front in such a way that it is kept in a first position against an elastic force by the pressure acting on the sensor surface if the said pressure is above the threshold whereas it is kept in a second position by the said elastic force if the pressure is below the threshold, the sensor piston acting on the valve piston in such a way that the latter is in the blocking position if the sensor piston is in the first position and in the passing position if the sensor piston is in the second position.

12. Vacuum processing device according to claim 11, where the sensor piston acts on a first surface of the valve piston which is inclined with respect to the first direction and with respect to the second direction via a second surface of the sensor piston which is slidable along the first surface.

* * * * *